United States Patent
Takizawa

[19]

[11] Patent Number: 6,064,467
[45] Date of Patent: *May 16, 2000

[54] ALIGNMENT APPARATUS, AND EXPOSURE APPARATUS WITH THE ALIGNMENT APPARATUS

[75] Inventor: Naoki Takizawa, Kawaguchi, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/061,069

[22] Filed: Apr. 16, 1998

[30] Foreign Application Priority Data

Apr. 21, 1997 [JP] Japan .................................. 9-116007

[51] Int. Cl.$^7$ ............................ G03B 27/42; G03B 27/58
[52] U.S. Cl. ................................................. 355/53; 355/72
[58] Field of Search .................................. 355/53, 72, 73; 318/625–628, 363, 687; 414/749, 225, 321; 250/492.2

[56] References Cited

U.S. PATENT DOCUMENTS

| | | | |
|---|---|---|---|
| 5,382,095 | 1/1995 | Akutsu | 384/100 |
| 5,684,856 | 11/1997 | Itoh et al. | 378/34 |
| 5,726,548 | 3/1998 | Chiba et al. | 318/625 |
| 5,858,587 | 1/1999 | Yamane et al. | 355/53 |
| 5,864,389 | 11/1997 | Osanai et al. | 355/53 |

FOREIGN PATENT DOCUMENTS

| | | |
|---|---|---|
| 59-178507 | 10/1984 | Japan . |
| 5-215133 | 8/1993 | Japan . |
| 7-305724 | 11/1995 | Japan . |

*Primary Examiner*—Safet Metjahic
*Assistant Examiner*—Hung Henry Nguyen
*Attorney, Agent, or Firm*—Fitzpatrick, Cella, Harper & Scinto

[57] ABSTRACT

An alignment apparatus, which includes a stage which is supported by compressed fluid ejected from a bearing pad in a non-contact state from a translation drive guide, a linear motor serving as a driving device of the stage, position detectors for detecting the position of the stage, and a controller for aligning the stage on the basis of a position signal detected by the position detectors, attains high alignment precision by including a plurality of gap driving devices for changing the support force of the stage by varying the bearing gap of the stage, a plurality of displacement detectors for detecting any displacements of the bearing gap, and a controller for controlling any rotational vibration produced upon driving the stage by combining alignment control for synchronously controlling the linear motor and control for the support force by the bearing gap driving device, on the basis of signals detected by the position detectors of the stage and the displacement detectors for detecting the displacements of the bearing gap.

12 Claims, 9 Drawing Sheets

SEMICONDUCTOR DEVICE MANUFACTURING FLOW

ALIGNMENT APPARATUS, AND EXPOSURE APPARATUS WITH THE ALIGNMENT APPARATUS

BACKGROUND OF THE INVENTION

The present invention relates to an alignment apparatus used in semiconductor manufacturing apparatuses, various machine tools, and the like.

Conventionally, the following two examples are known as an alignment apparatus used in semiconductor manufacturing apparatuses, various machine tools, and the like. The first example is an alignment apparatus which drives a movable member by converting rotation of a motor into translation using a feed screw. The second example is an alignment apparatus which uses a linear motor in a driving system, and also uses a non-contact guide that supports a movable member using the pressure of compressed fluid, as described in Japanese Patent Laid-Open No. 59-178507.

However, in the first example, the reproducibility of alignment precision in the feed and reverse directions is poor due to the influences of friction or the like of the feed screw. More specifically, the alignment precision suffers, owing to nonlinear factors such as friction. In order to improve the alignment precision, a nonlinear compensation element such as for friction compensation or the like must be added to a control system. In such a case, since the arrangement of the overall system is complicated, it becomes hard to adjust a controller. Also, when the characteristics of the nonlinear element have changed due to aging of the frictional force as a result of the use of the apparatus, the control system and mechanical components must be re-adjusted.

The second example is directed to an alignment apparatus based on drive control using a linear motor. This apparatus suffers a lower support rigidity in the feed direction than that using the feed screw or the like. FIG. 8 shows the arrangement of a general position control loop of the conventional alignment apparatus. A detector 805 detects the state variables (XO, YO) of a movable member (X-Y stage) 804 in response to command variables (XI, YI), and feeds them back to a controller 802. In general, since the driving system using a linear motor normally has an insufficient rigidity in the feed direction, if the natural frequency of the alignment mechanism falls within the control frequency band of alignment, it may impair the alignment precision. Hence, when a linear motor is used in the alignment mechanism, it is important to increase its rigidity. When the control frequency of the linear motor agrees with the natural frequency of the alignment apparatus in the feed direction, they cause resonant vibrations, and make the alignment control unstable.

In this alignment apparatus, the linear motor serving as the driving source is independent from any position detection mechanism of the motor shaft corresponding to a rotary encoder, resolver, or the like, and a position detector is attached to the movable member to be controlled and detects its movement to feed it back to the controller. In this case, the influences of local resonant vibrations of an attachment member of the position detector may be superposed on the vibration characteristics of the overall system.

To compensate for the low support rigidity of the movable member in the feed direction and to avoid the influences of resonance in the control frequency band, it becomes difficult to appropriately set setting parameters (gains) of the control loop. As a consequence, the settling time is prolonged due to the influences of residual errors with respect to the target position, and vibrations produced due to the movement of the movable member, resulting in a long alignment time.

SUMMARY OF THE INVENTION

The present invention has been made in consideration of these problems, and has as its object to provide an alignment apparatus which can improve the rigidity in the feed direction while attaining high alignment precision.

In order to solve the above problems and to achieve the above object, the present invention comprises the following arrangement.

That is, an alignment apparatus, which comprises a movable member supported by a compressed fluid bearing, driving means for driving the movable member in a feed direction, and measurement means for measuring a position of the movable member, comprises a plurality of bearing gap driving means for producing a support force of the movable member in a gap direction of the compressed fluid bearing, a plurality of displacement detection means for detecting displacements of the compressed fluid bearing in the gap direction, and control means for controlling a rotational vibration of the movable member produced upon driving the movable member in the feed direction, on the basis of displacement information detected by the displacement detection means.

Also, an alignment apparatus, which comprises a stage which is supported by compressed fluid ejected from a bearing pad in a non-contact state from a translation drive guide, a linear motor serving as driving means of the stage, position detection means for detecting a position of the stage, and control means for aligning the stage on the basis of a position signal detected by the position detection means, comprises a plurality of gap driving means for changing a support force of the stage by varying a bearing gap of the stage, a plurality of displacement detection means for detecting displacements of the bearing gap, and control means for controlling a rotational vibration produced upon driving the stage by combining alignment control for synchronously controlling the linear motor and control for the support force by the bearing gap driving means, on the basis of signals detected by the position detection means of the stage and the displacement detection means for detecting the displacements of the bearing gap.

According to a preferred aspect of the present invention, an alignment apparatus used in an exposure apparatus comprises a plurality of bearing gap driving means for producing a support force of the movable member in a gap direction of the compressed fluid bearing, a plurality of displacement detection means for detecting displacements of the compressed fluid bearing in the gap direction, and control means for controlling a rotational vibration of the movable member produced upon driving the movable member in the feed direction, on the basis of displacement information detected by the displacement detection means.

According to a preferred aspect of the present invention, an alignment apparatus used in an exposure apparatus comprises a plurality of gap driving means for changing a support force of the stage by varying a bearing gap of the stage, a plurality of displacement detection means for detecting displacements of the bearing gap, and control means for controlling a rotational vibration produced upon driving the stage by combining alignment control for synchronously controlling the linear motor and control for the support force by the bearing gap driving means, on the basis of signals detected by the position detection means of the stage and the displacement detection means for detecting the displacements of the bearing gap.

According to a preferred aspect of the present invention, each of the plurality of bearing gap driving means comprises a piezoelectric element and bearing pad, and changes the support force by varying the bearing gap upon expansion/shrinkage of the piezoelectric element.

According to a preferred aspect of the present invention, the control means changes the support force by controlling the bearing gap.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE INVENTION

Preferred embodiments of the present invention will be described in detail in accordance with the accompanying drawings.
(First Embodiment)

Figure 1:
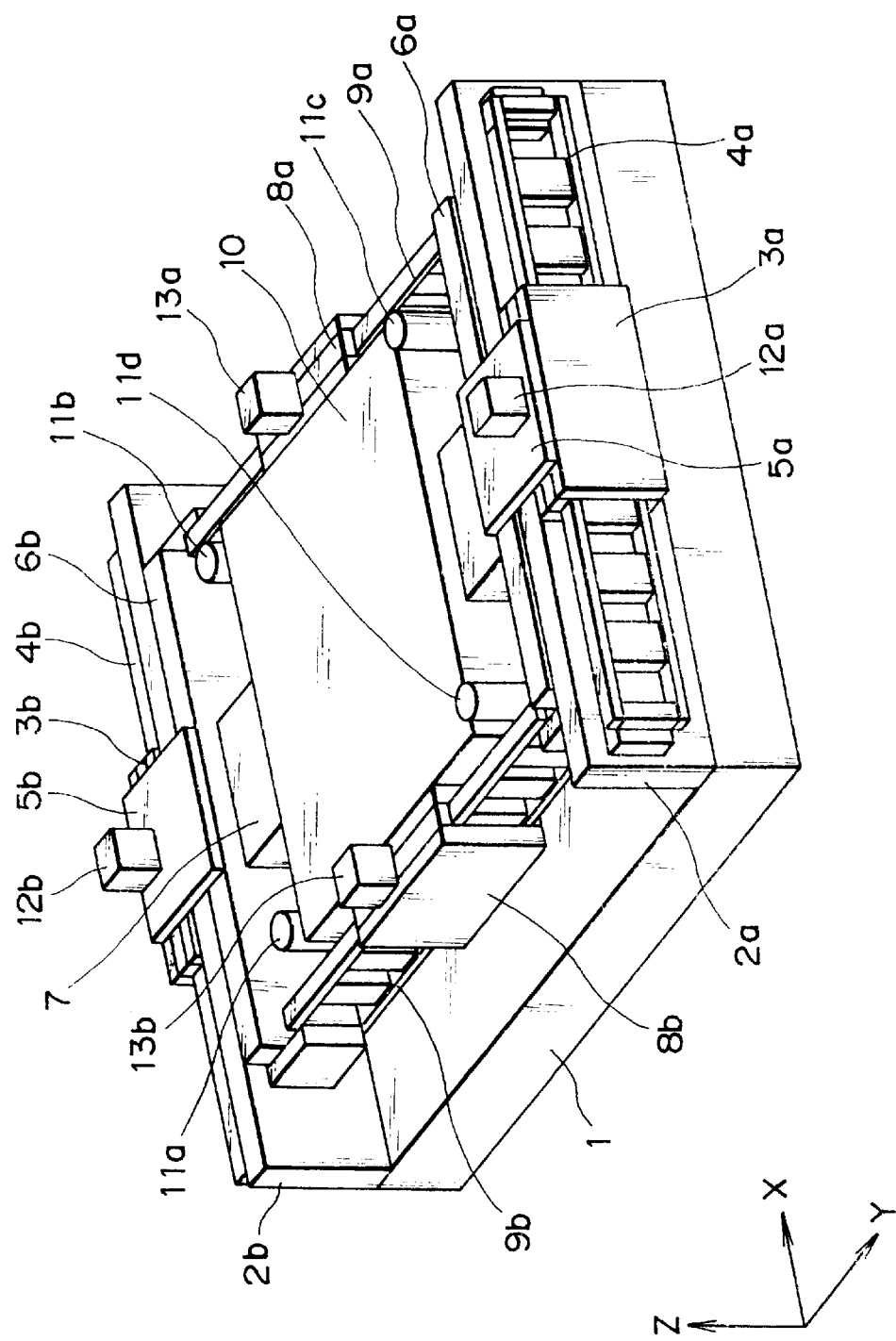
FIG. 1 is a perspective view showing the arrangement of an X-Y stage according to an embodiment of the present invention.
Figure 2A:
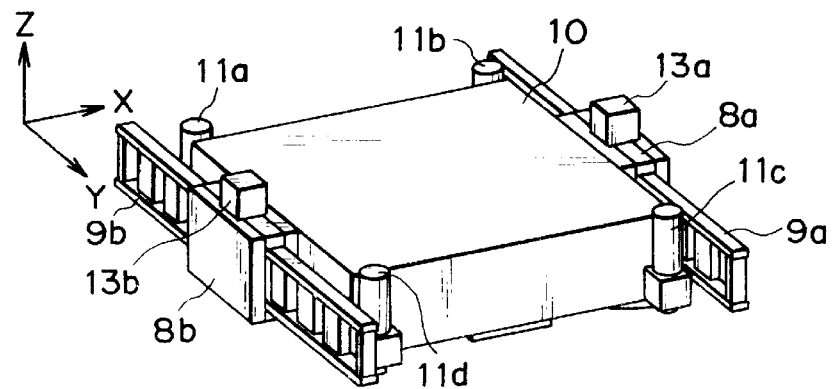
FIG. 2A is a perspective view showing an X-stage of the X-Y stage shown in FIG. 1.
Figure 2B:
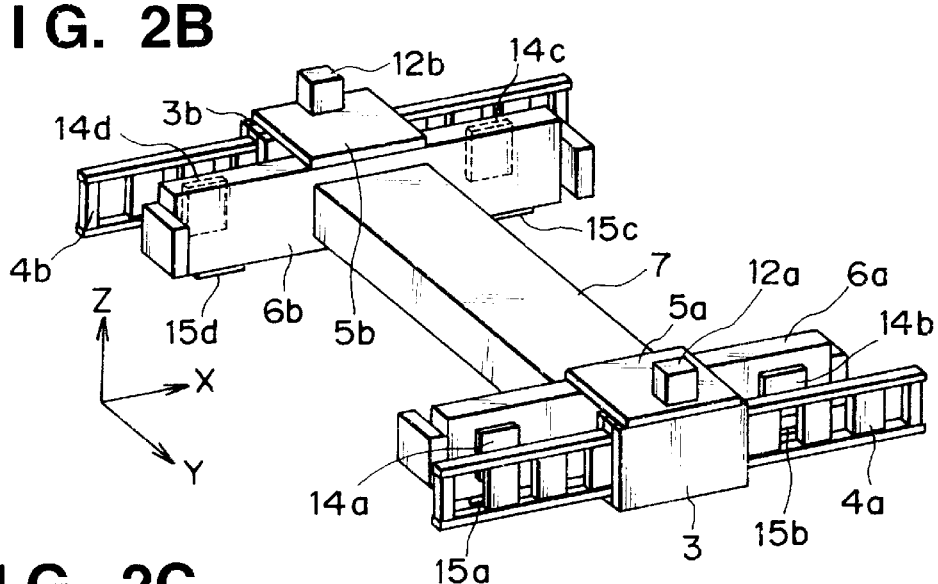
FIG. 2B is a perspective view showing a Y-stage of the X-Y stage shown in FIG. 1.
Figure 2C:
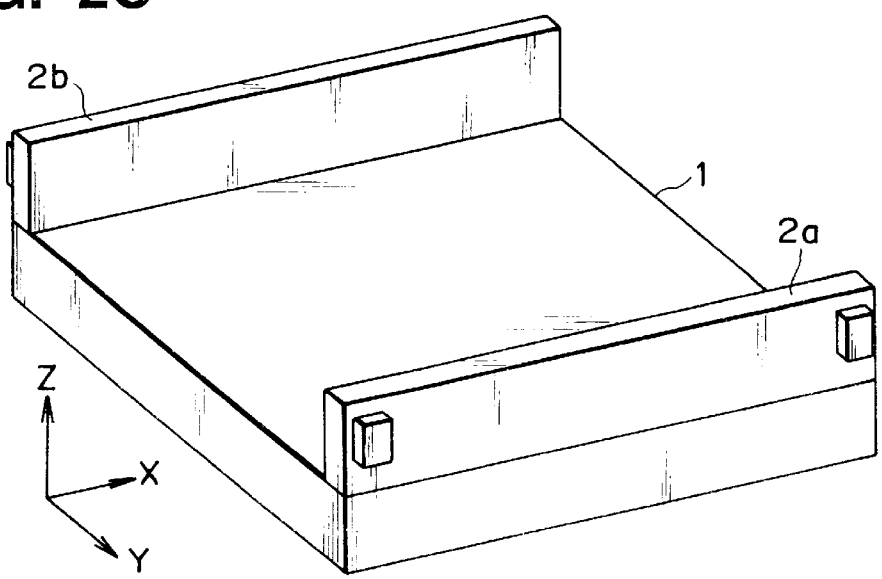
FIG. 2C is a perspective view showing a base portion on which the X-Y stage is set.
Figure 3:
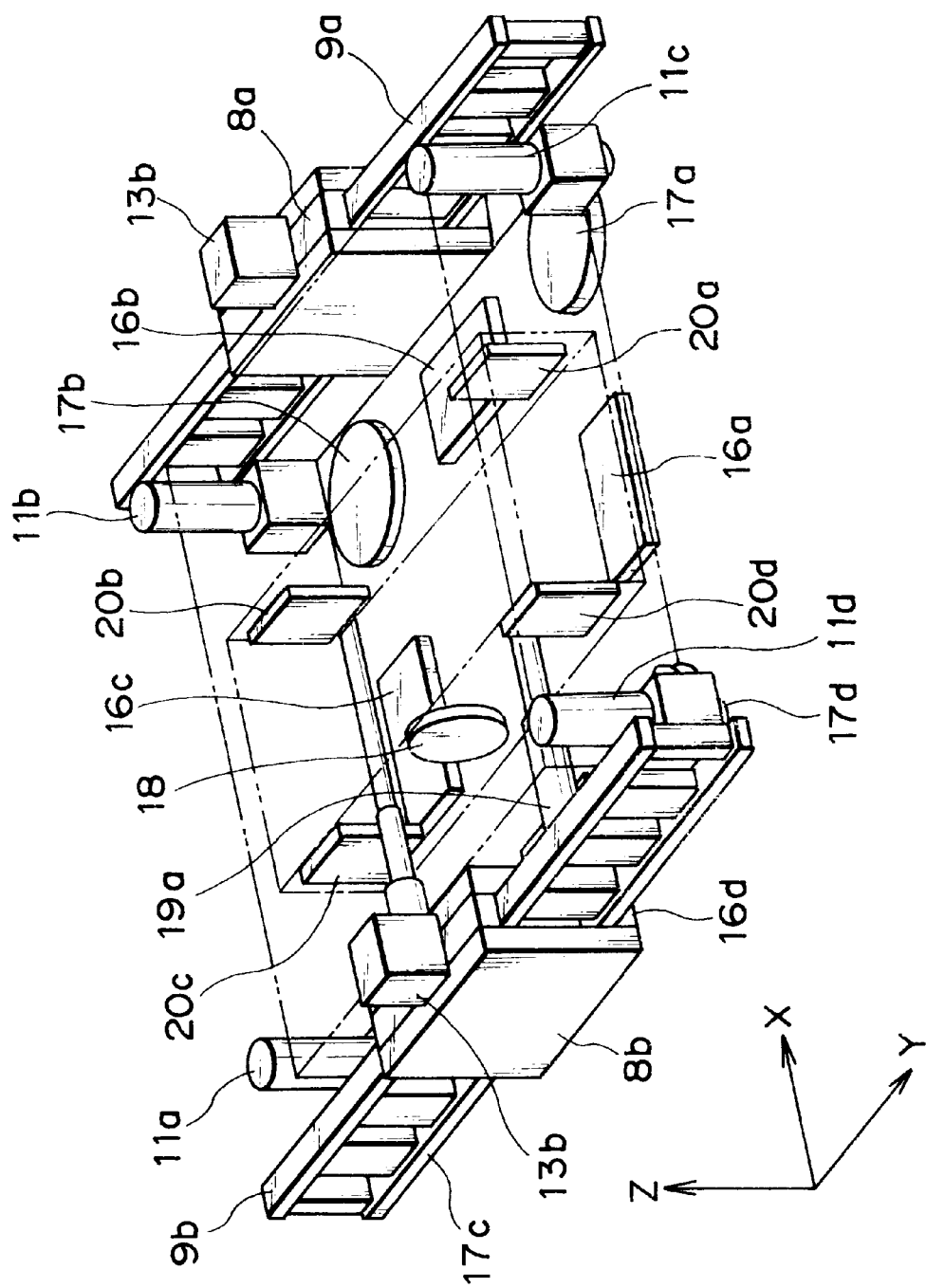
FIG. 3 is a perspective view for explaining the arrangement of the Y-stage in FIG. 1 in detail.
Figure 4:
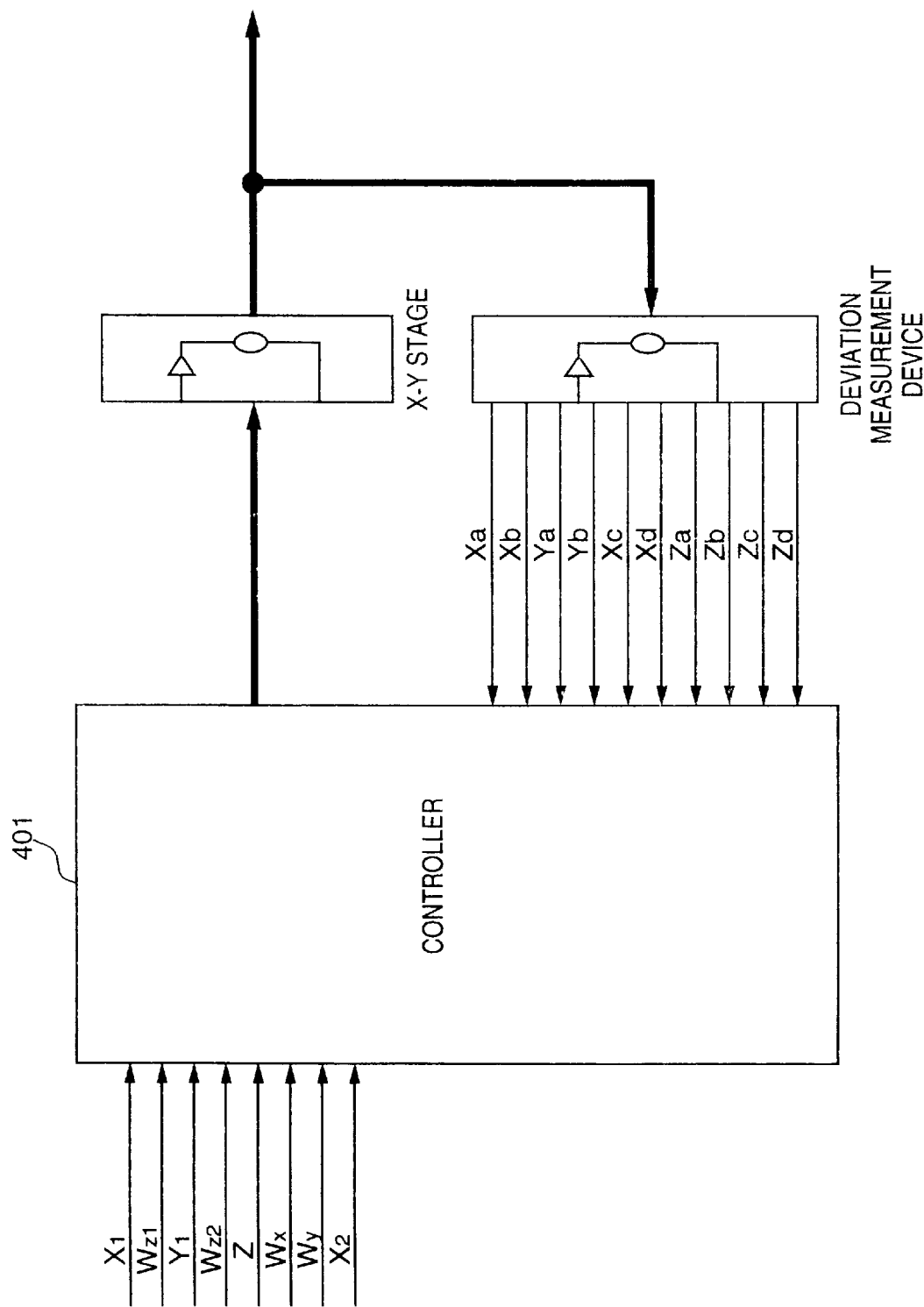
FIG. 4 is a block diagram showing the arrangement for controlling the X-Y stage shown in FIG. 1.

FIGS. 1 to 3 show the arrangement of an X-Y stage according to an embodiment of the present invention. FIG. 1 shows the overall X-Y stage, FIG. 2A shows an X-stage of the X-Y stage shown in FIG. 1, FIG. 2B shows a Y-stage thereof, and FIG. 2C shows a base portion on which the X-Y stage is set. FIG. 3 is a perspective view for explaining the arrangement of the Y-stage in detail. FIG. 4 is a block diagram showing the arrangement for controlling the X-Y stage.

In FIGS. 1 to 3, reference numeral 1 denotes a base; 2a and 2b, X-guides; 3a and 3b, the rotors of linear motors which are disposed at the two ends of the X-stage to drive an X-stage; 4a and 4b, stators that make up the linear motors together with the rotors; and coupling plates 5a and 5b which are coupled to members 6a and 6b. The X-stage made up of the members 6a and 6b and a member 7 is driven by the rotors 3a and 3b via the coupling plates 5a and 5b.

The constituting member 7 of the X-stage also serves as a guide for a Y-stage (to be described below). Reference numerals 8a and 8b denote the rotors of linear motors which are disposed at the two ends of the Y-stage to drive the Y-stage; 9a and 9b, stators that make up the linear motors together with the rotors 8a and 8b; 10, a Y-stage that moves in the Y-direction; 11a, 11b, 11c, and 11d, displacement detectors for detecting the displacements of the Y-stage 10 in the Z-direction; 12a and 12b, measurement mirrors used for measuring the displacements of the X-stage in the X-direction by laser interferometers; 13a and 13b, measurement mirrors used for measuring the displacements of the Y-stage in the Y-direction by laser interferometers; 14a, 14b, 14c, and 14d (some of them are not shown), bearing pads that eject supplied compressed fluid to support the X-stage in a non-contact state from the guides 2a and 2b; and 15a, 15b, 15c, and 15d, bearing pads which have the same functions as those of the pads 14a to 14d, and support the X-stage in a non-contact state from the base 1.

Reference numerals 16a, 16b, 16c, and 16d (some of them are not shown) denote bearing pads attached to the bottom surface of the Y-stage, which have the same arrangement as that of the above-mentioned pads 14a to 14d, and support the Y-stage 10 in a non-contact state from the base 1.

Figure 5:
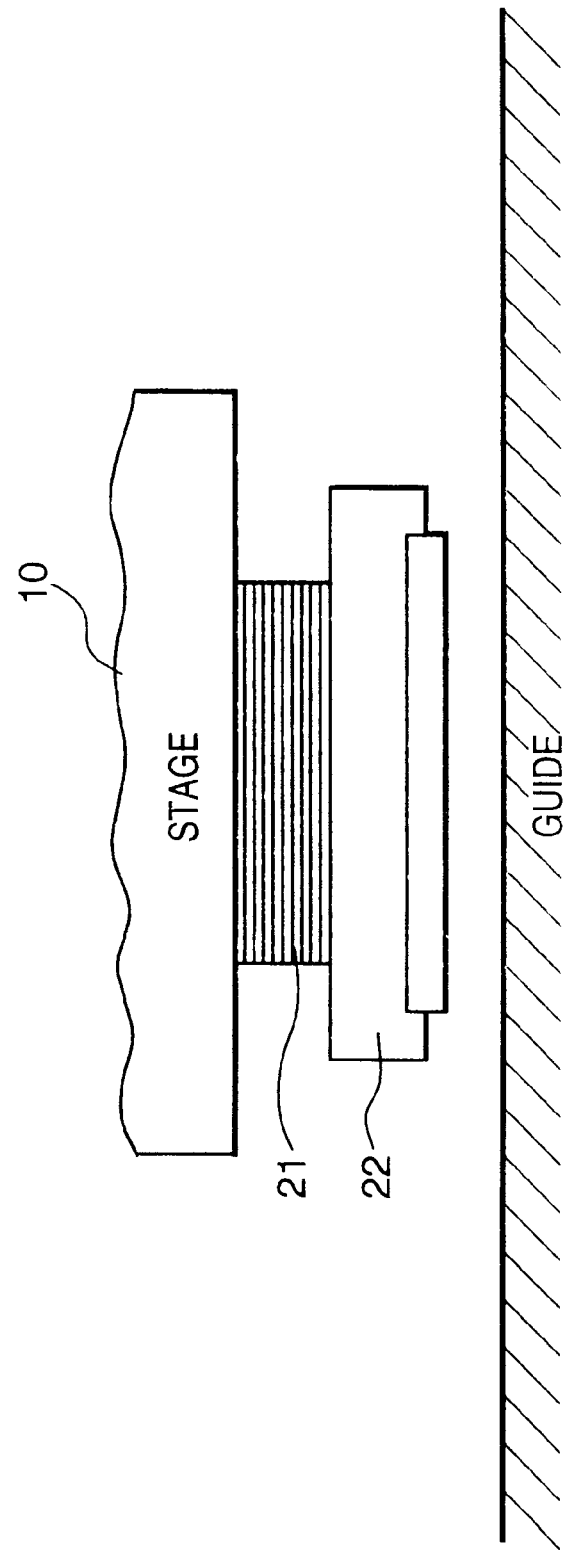
FIG. 5 is a side view for explaining an active bearing in the X-Y stage shown in FIG. 1.

Reference numerals 17a, 17b, 17c, and 17d (some of them are not shown) denote driving units for changing the bearing gaps of the Y-stage 10 in the Z-direction. When compressed fluid is supplied at a constant pressure, if the gap with the guide surface decreases, the rigidity (support force of a movable member) tends to increase. The driving units 17a to 17d serve to forcibly produce the support force of the movable member. FIG. 5 shows the driving units 17a in detail (the units 17b to 17d have the same structure). The unit 17a is a device prepared by inserting a piezoelectric element 21 between a bearing pad 22 and the Y-stage 10, and serves as an active bearing device for producing the support force of the movable member by varying the bearing gap by means of expansion/shrinkage of the piezoelectric element 21.

Reference numeral 18 denotes an active bearing device which has the same structure as those of the driving units 17a to 17d, and forcibly produces the support force of the movable member in the bearing gap of the Y-stage 10 in the X-direction. Reference numerals 19a and 19b (the detector 19b is not shown) denote displacement detectors for detecting the bearing gaps of the Y-stage in the X-direction, which have been changed by the active bearing device 18 or due to externally applied forces. Reference numerals 20a, 20b, 20c, and 20d denote bearing pads, which are the same as the pads 14a to 14d, and support the Y-stage 10 in the X-direction in a non-contact state from the Y-guide 7.

The X-stage is supported in a non-contact manner by compressed fluid ejected from the bearing pads 14a to 14d and 15a to 15d with respect to the base 1 and X-guides 2a and 2b. Also, the Y-stage is supported in a non-contact manner by compressed fluid ejected from the bearing pads 16a to 16d and 20a to 20d, and the active bearing devices 17a to 17d and 18 with respect to the base 1 and the X-stage.

In the X-Y stage shown in FIG. 1, the position information of the X-stage is measured by the measurement mirrors 12a and 12b, and the linear motors 3a and 4a, and 3b and 4b are driven in the X-direction on the basis of the measured position data Xa and Xb in the X-direction.

Similarly, the position information of the Y-stage is measured by the measurement mirrors 13a and 13b, and the linear motors 8a and 9a, and 8b and 9b are driven in the Y-direction on the basis of the measured position data Ya and Yb in the Y-direction.

In this case, the position control for the individual linear motors alone may often produce positional deviations in the direction of rotation in the movements of the X- and Y-axes. Unless the linear motors for each axis (e.g., in the case of the X-axis, the linear motors 3a and 4a, and 3b and 4b) undergo alignment control with synchronous position correction, the alignment control system becomes unstable due to vibrations in an axial direction of the individual stages other than the alignment directions (for example, vibrations in the direction of rotation about the Z-axis with respect to translations in the X- and Y-directions).

According to the embodiment of the present invention, in order to remove vibrations in the direction of rotation produced upon alignment, the driving units and measurement units are disposed to attain alignment in the direction of translation and control in the direction of rotation.

Figure 9:
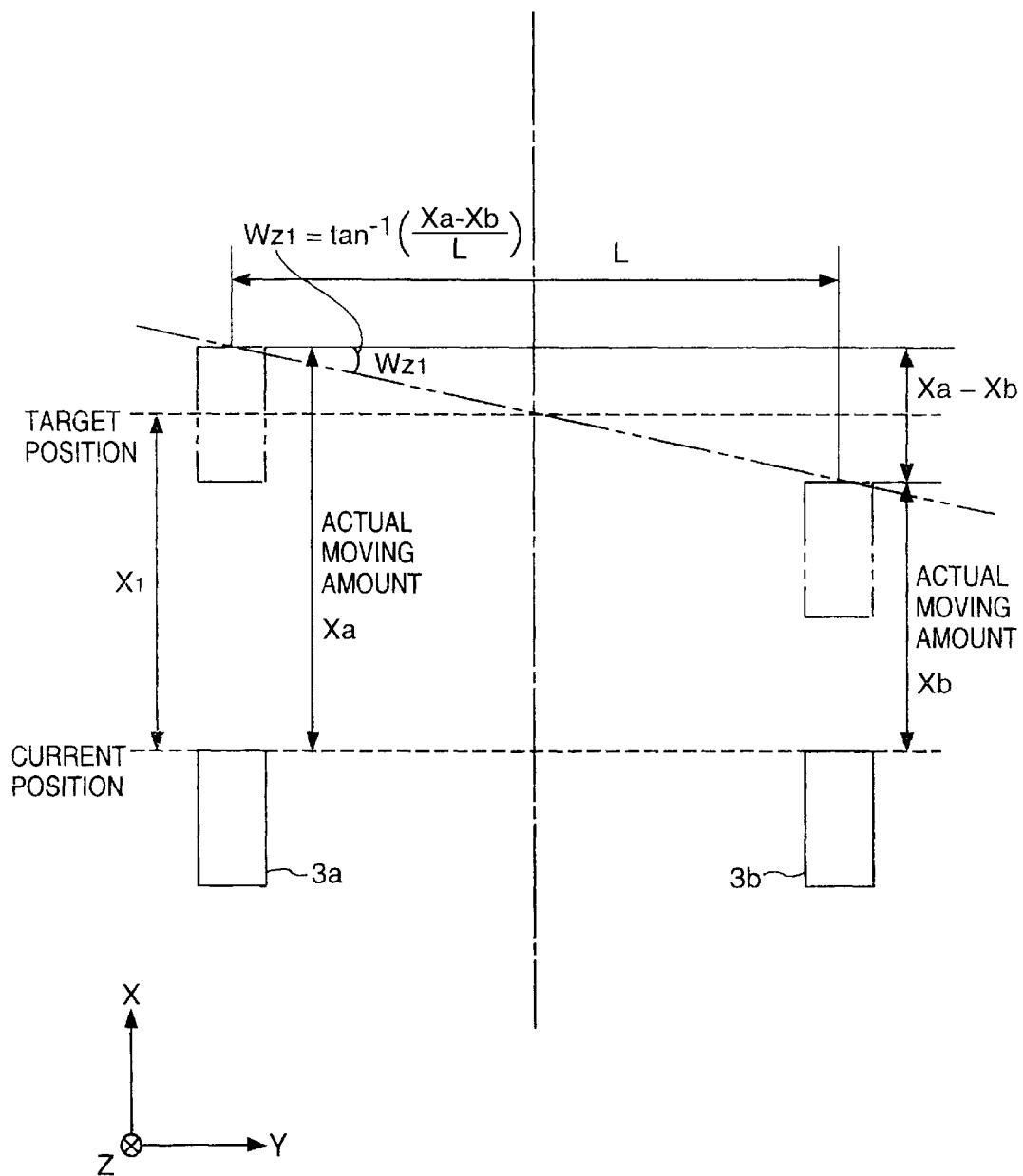
FIG. 9 is a chart for explaining the practical alignment control of an X-table.

In the X-stage, simultaneously with alignment by an amount $X_1$ in the X-direction, a rotation angle $W_{z1}$ about the Z-axis is obtained by calculating the difference between the displacement data Xa and Xb respectively measured by the mirrors 12a and 12b to control the linear motors 3a and 4a, and 3b and 4b, thus controlling vibrations in the direction $W_{z1}$ of rotation about the Z-axis (or positional deviations in the direction of rotation). The state variables in the X-direction include two variables, i.e., the position information corresponding to the translation (target value $X_1$) and the rotation information (the correction amount $W_{z1}$ of the rotation angle) corresponding to the rotation. FIG. 9 explains the practical alignment control of an X-table in the directions of translation and rotation. Paying attention to the movements of the linear motor rotors 3a and 3b, assume that a deviation is produced between the actual moving amount and the target position when the linear motor rotors are respectively driven to have $X_1$ (first state variable) as the target position in the direction of translation. If the moving amount Xa of the rotor 3a overshoots the target position ($X_1$) and the moving amount Xb of the rotor 3b undershoots the target position ($X_1$), the X-table produces a positional deviation of the rotation angle $W_{z1}$ (second state variable) with respect to the target position. The rotation angle is given by:

$$W_{z1} = \text{Arctan}\{(Xa-Xb)/L\} \quad (1)$$

(where L is the spacing between the rotors 3a and 3b).

Convergence control to the target position may be attained by independently controlling the linear motor rotors 3a and 3b. However, in such a case, since the movements of the two rotors are opposite to each other, self-excited vibrations are readily produced, resulting in poor settlement performance. In the worst case, divergent vibrations are produced, and the control of the alignment apparatus becomes unstable. Using the state variable based on the rotation angle, the two rotors can be synchronously controlled, thus attaining alignment with high convergence.

In the Y-stage, simultaneously with alignment by an amount $Y_1$ in the Y-direction, a rotation angle $W_{z2}$ about the Z-axis is obtained by calculating the difference between the displacement data Ya and Yb respectively measured by the mirrors 13a and 13b as in the X-stage, thereby controlling the vibrations in the direction of rotation about the Z-axis. The state variables in the Y-direction include two variables, i.e., the position information corresponding to the translation (target value $Y_1$) and the rotation information (the correction amount $W_{z2}$ of the rotation angle) corresponding to the rotation as in the X-direction.

Furthermore, as for the Y-stage, the support force of the movable member is controlled by changing the gaps between the active bearings 17a to 17d and the guide surface on the basis of the deviation in the Z-direction, a rotation angle $W_x$ about the X-axis (arctangent based on the difference between the displacements in the Z-direction detected by the detectors 11a and 11b, and 11c and 11d), and a rotation angle $W_y$ about the Y-axis (arctangent based on the difference between the displacements in the Z-direction detected by the detectors 11a and 11d, and 11b and 11c), which are obtained by calculating the position data Za to Zd in the Z-direction detected by the displacement detectors 11a to 11d. The alignment apparatus controls vibrations of the Y-stage in the Z-direction, and its rotations $W_x$ and $W_y$ about the X- and Y-axes.

The reason why this embodiment controls the displacement Z of the Y-stage in the Z-direction and its rotations $W_x$ and $W_y$ about the X- and Y-axes is that the Y-stage is influenced more easily by vibrations other than in the alignment directions since its size, weight, and the like are smaller than those of the X-stage. Of course, the displacement of the X-stage in the Z-direction, and its rotations about the X- and Y-axes may be controlled to expect the same effect as that in the Y-stage. However, the effect is not remarkable as compared to the Y-stage.

Furthermore, in the Y-stage, the two displacement detectors 19a and 19b (the detector 19b is not shown) for detecting displacements Xc and Xd of the bearing gap of the Y-stage in the X-direction, and the active bearing 18 for producing a force in the bearing gap direction of the X-direction are disposed to improve the rigidity of the bearings in the X-direction, and a bearing gap $X_2$ of the Y-stage in the X-direction is controlled based on the displacements Xc and Xd of the gearing gap detected by the displacement detectors 19a and 19b. In this manner, since the rigidity of the Y-stage in the X-direction is improved by controlling the bearing gap of the Y-stage in the X-direction, the rigidity of the whole X-Y stage can be improved in the X-direction.

The above-mentioned control is implemented by a controller shown in FIG. 4. A controller 401 receives as target values the following eight parameters ($X_1$, $W_{z1}$, $Y_1$, $W_{z2}$, Z, $W_x$, $W_y$, and $X_2$). The parameters include $X_1$ that defines the alignment direction of the X-stage, $W_{z1}$ that represents the direction of rotation of the X-stage about the Z-axis, $Y_1$ that defines the alignment direction of the Y-stage, $W_{z2}$ that represents the direction of rotation of the Y-stage about the Z-axis, Z that represents the displacement of the Y-stage in the Z-direction, $W_x$ that represents the direction of rotation of the Y-stage about the X-axis, $W_y$ that represents the direction of rotation of the Y-stage about the Y-axis, and $X_2$ that represents the bearing gap of the Y-stage in the X-direction.

The displacement signals, X-axis (Xa, Xb), Y-axis (Ya, Yb), the displacement (Xc, Xd) of the Y-stage in the X-direction, and Z-axis (Za, Zb, Zc, Zd) detected by a plurality of displacement measurement devices arranged on the X-Y stage are fed back to the controller 401 to calculate deviations of the displacement or vibration amounts along the individual axes ($X_1$, $W_{z1}$, $Y_1$, Z, $W_z$, $W_y$, and $X_2$) corresponding to the respective parameters. The controller 401 issues control commands to the respective axes to attain alignment to a predetermined position. When vibrations have been produced, the controller 401 decreases the bearing gap to increase the rigidity, thus controlling the produced vibrations. Translation displacements are controlled to the target position, and vibrations are controlled to zero.

As described above, according to the present invention, driving units for producing the support force of a movable member in the bearing gap and displacement measurement means are disposed together with driving units for alignment, and detection units for detecting displacements in the alignment directions. Simultaneously with the feedback control of the displacements in the alignment directions, another feedback control is done to remove vibrations other than in the alignment directions. In this way, vibrations in the direction of rotation produced upon alignment in the direction of translation are positively controlled, thus improving the alignment precision. Furthermore, since driving units for actively changing the gap between compressed fluid bearings and the guide surface are arranged, vibrations that are readily produced upon alignment can be suppressed by varying the support force (rigidity) of a lightweight movable member. The alignment apparatus according to the present invention can solve the problems in the prior art, and can improve the rigidity of a servo system in the alignment direction. As a consequence, residual vibrations upon alignment can be reduced, the settling time can be shortened, and the alignment performance of the apparatus can be improved.

(Second Embodiment)

An embodiment in which the alignment apparatus described in the first embodiment is applied to an exposure apparatus will be explained below.

Figure 6:
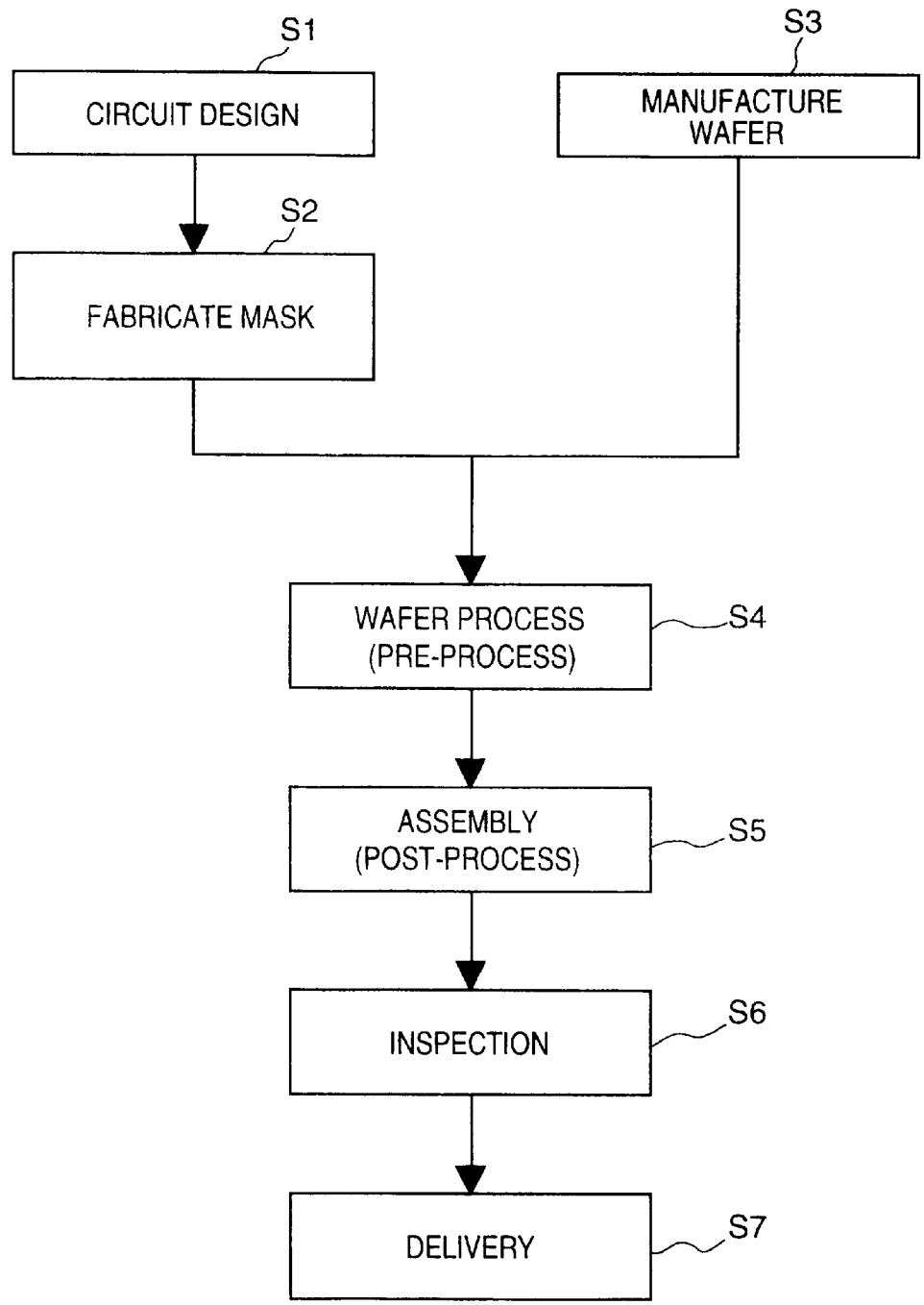
FIG. 6 is a flow chart showing the manufacturing processes of a microdevice.

FIG. 6 shows the flow in the manufacture of a microdevice (e.g., semiconductor chips such as ICs, LSIs, liquid crystal devices, thin film magnetic heads, micromachines, and the like). In step 1 (circuit design), the circuit design of a semiconductor device is made. In step 2 (manufacture mask), a mask formed with a designed circuit pattern is manufactured. In step 3 (fabricate wafer), a wafer is fabricated using materials such as silicon and the like. Step 4 (wafer process) is called a pre-process, and an actual circuit is formed by lithography using the prepared mask and wafer. The next step 5 (assembly) is called a post-process, in which semiconductor chips are assembled using the wafer obtained in step 4, and includes an assembly process (dicing, bonding), a packaging (encapsulating chips), and the like. In step 6 (inspection), inspections such as operation confirmation tests, durability tests, and the like of semiconductor devices assembled in step 5 are run. Semiconductor devices are completed via these processes, and are delivered (step 7).

Figure 7:
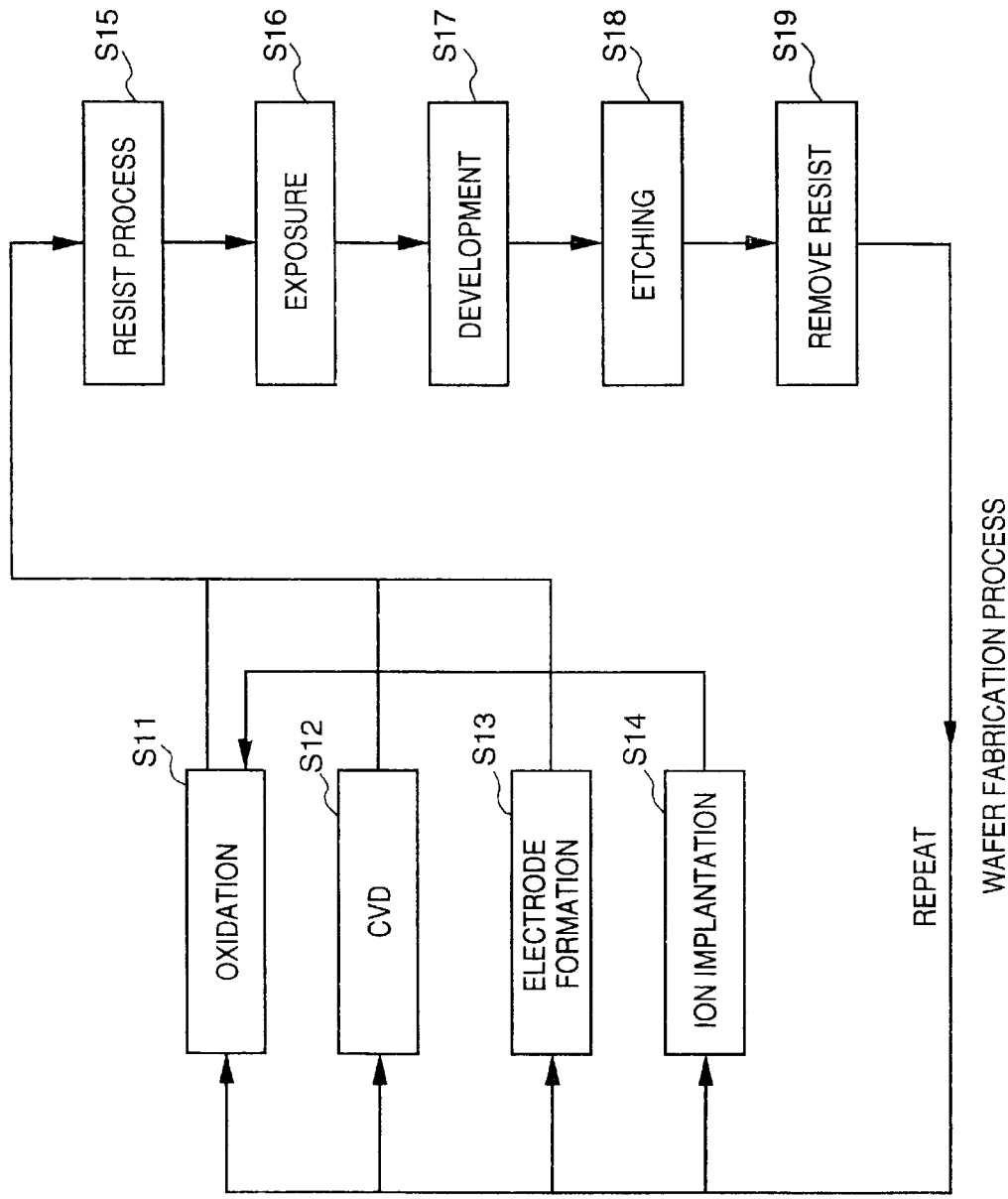
FIG. 7 is a flow chart for explaining the semiconductor manufacturing processes in FIG. 6.
Figure 8:
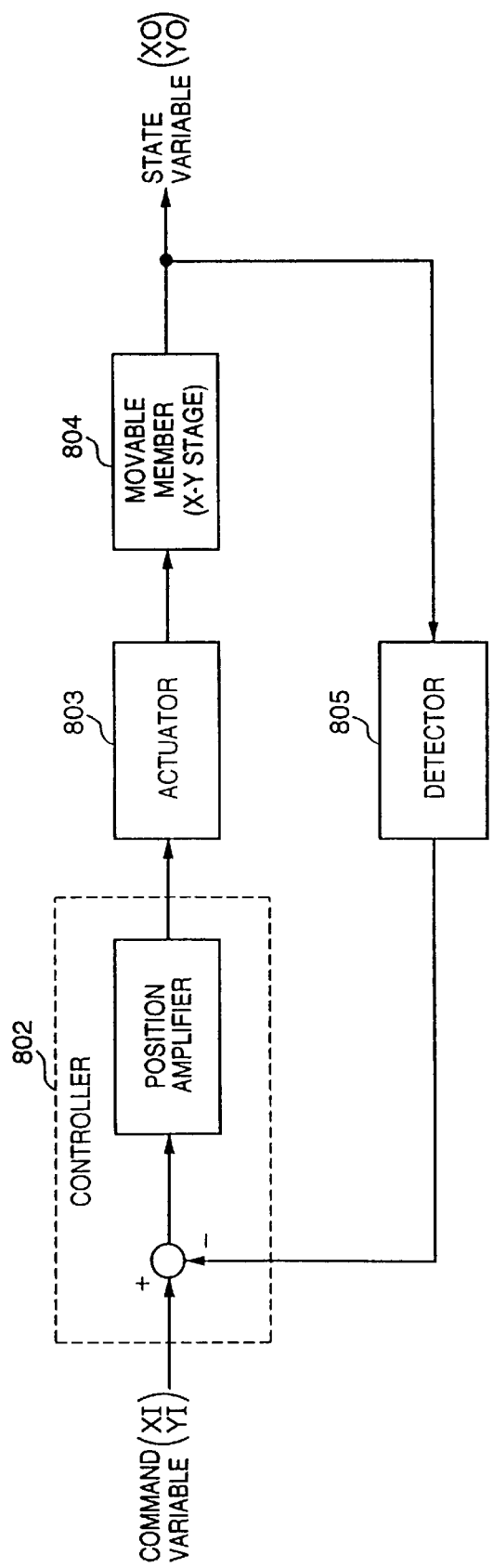
FIG. 8 is a block diagram for explaining the conventional position control.

FIG. 7 shows the detailed flow of the wafer process. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the electron beam exposure apparatus. In step 17 (development), the exposed wafer is developed. In step 18 (etching), a portion other than the developed resist image is removed by etching. In step 19 (remove resist), the resist film which has become unnecessary after the etching is removed. By repetitively executing theme steps, multiple circuit patterns are formed on the wafer.

In this embodiment, the present invention is applied to practical manufacturing processes, and when the above-mentioned alignment apparatus is used in repetitive processes, alignment can be realized more precisely than with the conventional alignment apparatus. Use of the apparatus of the present invention is a breakthrough in circuit designs and inspection techniques that have been restrained by alignment precision, and can attain a further decrease in feature size of the circuit design. Hence, highly integrated devices which are hard to manufacture by the conventional system can be manufactured with low cost.

The present invention is not limited to the above embodiments and various changes and modifications can be made within the spirit and scope of the present invention. Therefore, to apprise the public of the scope of the present invention, the following claims are made.

What is claimed is:

1. An alignment apparatus which comprises a base having a reference surface, a movable stage, supported on the base in a supporting direction by a plurality of compressed fluid bearings, and driving means for driving the movable stage on the base in a feed direction perpendicular to the supporting direction, said apparatus comprising:

a plurality of bearing gap driving means for producing a support force of the movable stage in the supporting direction of the compressed fluid bearings;

a plurality of displacement detection means for detecting gaps between said base and said movable stage; and control means for controlling said bearing gap driving means, and for controlling a rotational vibration based on said detected varying of gaps coupled and produced upon driving the movable stage to the base in the feed direction, on the basis of gap information detected by said displacement detection means.

2. The apparatus according to claim 1, wherein each of said plurality of bearing gap driving means comprises a piezoelectric element and a bearing pad, and changes the support force by varying a bearing gap upon expansion/shrinkage of said piezoelectric element.

3. The apparatus according to claim 1, wherein said control means changes the support force by controlling the bearing gaps.

4. An alignment apparatus which comprises a stage having a plurality of compressed fluid bearing pads for supporting the stage, which is supported by compressed fluid ejected from the bearing pads in a non-contact state from a translation drive guide in a supporting direction, and a linear motor serving as driving means of the stage in a feed direction perpendicular to the supporting direction, said apparatus comprising:

a plurality of gap driving means for changing a support force of the stage in the supporting direction by varying bearing gaps of the stage;

a plurality of displacement detection means for detecting signals corresponding to gaps between the stage and the translation drive guide; and control means for controlling a rotational vibration produced upon driving the stage in the feed direction by combining an alignment control for synchronously controlling the linear motor in the feed direction and control for the support force in the supporting direction by said bearing gap driving means, on the basis of the signals detected by said displacement detection means.

5. The apparatus according to claim 4, wherein each of said plurality of bearing gap driving means comprises a piezoelectric element and a bearing pad, and changes the support force by varying a bearing gap upon expansion/shrinkage of said piezoelectric element.

6. The apparatus according to claim 4, wherein said control means changes the support force by controlling the bearing gaps.

7. An exposure apparatus having an alignment means, said apparatus comprising:

a plurality of bearing gap driving means for producing a support force of a movable stage supported on a base in a supporting direction by a plurality of compressed fluid bearings driven by the bearing gap driving means;

a plurality of displacement detection means for detecting displacements of the movable stage from the base in the supporting direction; and control means for controlling a rotational vibration of the movable stage produced upon driving the movable stage in a feed direction perpendicular to the supporting direction, on the basis of displacement information detected by said displacement detection means.

8. An exposure apparatus having an alignment means with a base, a stage on the base supported by a plurality of compressed fluid bearings in a supporting direction, and a linear motor for driving the stage on the base in a feed direction perpendicular to the supporting direction, said apparatus comprising:

a plurality of bearing gap driving means for changing a support force in the supporting direction of the stage by varying bearing gaps of the stage;

a plurality of displacement detection means for detecting displacements of the stage from the base; and control means for controlling a rotational vibration produced upon driving the stage by combining an alignment control for synchronously controlling the linear motor in the feed direction and control for the support force in the supporting direction by said bearing gap driving means, on the basis of displacements detected by said displacement detection means.

9. An alignment apparatus comprising:

a movable stage, movable in an X-direction and a Y-direction, supported on a base by a plurality of non-contact bearings in a Z-direction;

a plurality of means for changing a support force of said movable stage in the Z-direction;

a plurality of displacement detection means for detecting displacement of said movable stage from the base in the Z-direction; and control means for controlling the support force on the basis of displacement information detected by said plurality of displacement detection means, said control means controlling vibration of said movable stage in a direction of rotation about the X-axis and the Y-axis produced upon driving said movable stage in the X-direction and the Y-direction.

10. The apparatus according to claim 9, wherein said non-contact bearing comprises a compressed fluid bearing.

11. The apparatus according to claim 9, further comprising linear motors for driving said movable member.

12. The apparatus according to claim 9, wherein said plurality of means for changing a support force comprise piezoelectric elements inserted between the non-contact bearing and said movable member.

* * * * *

UNITED STATES PATENT AND TRADEMARK OFFICE
CERTIFICATE OF CORRECTION

PATENT NO. : 6,064,467
DATED : May 16, 2000
INVENTOR(S) : NAOKI TAKIZAWA

It is certified that error appears in the above-indentified patent and that said Letters Patent is hereby corrected as shown below:

Under "References Cited", "U.S. PATENT DOCUMENTS":
The following should be inserted: --5,610,686 3/1997 Osanai--; and --4,676,630 6/1987 Matsushita, et al.--.

Column 6

Line 54, "$(X_1, W_{Z1}, Y_1, Z, W_Z, W_Y, $ and $X_2)$" should read --$(X_1, W_{Z1}, Y_1, W_{Z2}, Z, W_X, W_Y, $ and $X_2)$--.

Column 7

Line 53, "theme" should read --these--.

Signed and Sealed this

Tenth Day of April, 2001

*Attest:*

NICHOLAS P. GODICI

*Attesting Officer*    *Acting Director of the United States Patent and Trademark Office*